US012764856B2

(12) United States Patent
Ducloyer et al.

(10) Patent No.: US 12,764,856 B2
(45) Date of Patent: Oct. 13, 2026

(54) ELECTRONIC CIRCUIT AND CORRESPONDING PROTECTION METHOD

(71) Applicant: BULL SAS, Les Clayes-sous-bois (FR)

(72) Inventors: Sylvain Ducloyer, Beynes (FR); Nicolas Coulon, Jouy-en-Josas (FR); Yannick Douard, Plaisir (FR)

(73) Assignee: BULL SAS, Les Clayes-sous-Bois (FR)

( * ) Notice: Subject to any disclaimer, the term of this patent is extended or adjusted under 35 U.S.C. 154(b) by 361 days.

(21) Appl. No.: 18/425,339

(22) Filed: Jan. 29, 2024

(65) Prior Publication Data

US 2024/0260176 A1 Aug. 1, 2024

(30) Foreign Application Priority Data

Jan. 27, 2023 (EP) .................................... 23305108

(51) Int. Cl.
*H05K 1/02* (2006.01)
*H05K 1/181* (2026.01)

(52) U.S. Cl.
CPC ........... *H05K 1/0292* (2013.01); *H05K 1/181* (2013.01); *H05K 2201/09227* (2013.01)

(58) Field of Classification Search
CPC .................................................... H05K 1/0292
USPC .......................................................... 361/760
See application file for complete search history.

(56) References Cited

U.S. PATENT DOCUMENTS 5,572,409 A * 11/1996 Nathan .................... G01R 1/04
257/209

FOREIGN PATENT DOCUMENTS

EP 2429267 A1 * 3/2012 ........... H05K 1/0293

OTHER PUBLICATIONS

European Search Report and Written Opinion issued in EP23305108.5 on Jul. 21, 2023 (7 pages).

* cited by examiner

*Primary Examiner* — Stanley Tso
(74) *Attorney, Agent, or Firm* — ARC IP Law, PC; Joseph J. Mayo

(57) ABSTRACT

The invention relates to an electronic circuit including a substrate and at least one electronic component. Each electronic component includes at least one data port that receives data. The electronic circuit also includes, for each data port, a current injection terminal and a breakable electrical trace located in the thickness of the substrate and extending between the data port and the injection terminal. Each breakable electrical trace includes a fusible segment, and each breakable electrical trace is configured to break, by melting of the fusible segment, upon the injection, at the injection terminal, of an electric current having an intensity greater than a predetermined trace breaking threshold.

9 Claims, 4 Drawing Sheets

ELECTRONIC CIRCUIT AND CORRESPONDING PROTECTION METHOD

This application claims priority to European Patent Application Number 23305108.5, filed 27 Jan. 2023, the specification of which is hereby incorporated herein by reference.

BACKGROUND OF THE INVENTION

Field of the Invention

At least one embodiment of the invention relates to an electronic circuit comprising a substrate and at least one electronic component, each electronic component including at least one data port for receiving data.

At least one embodiment of the invention also relates to a method for protecting such an electronic circuit against intrusions.

At least one embodiment of the invention applies to the field of electronics, and in particular to the design of electronic circuits including at least one electronic component, such as a programmable component.

Description of the Related Art

It is known to provide an electronic circuit with one or more programmable component(s), for example an FPGA (Field-Programmable Gate Array). Conventionally, such a programmable component includes at least one data port for writing instructions relating to its configuration.

During the phase of producing the electronic circuit, and after integrating the programmable component into said circuit, the configuration of the programmable component is generally implemented by the application of electrical signals (coding said instructions) at a probe, itself electrically connected to each data port via a bus.

For security reasons, especially for protecting the programmable component against intrusions aimed at reprogramming or reading the content thereof, such a bus must be made inoperative. It is especially known to break the coupon of the bus (that is, the area of the electronic circuit on which the bus is etched) to make it inoperative.

Nevertheless, such a method is not entirely satisfactory.

Indeed, despite such a break, the remaining parts of the bus are exposed and are therefore accessible. It is then possible to reconstruct the data link by analyzing these exposed parts in order to reconnect them. Therefore, a simple break in the bus coupon is not sufficient to ensure a satisfactory level of security.

At least one embodiment of the invention is thus to solve at least one of the shortcomings of the state of the art.

At least one embodiment of the invention is to propose an electronic circuit wherein it is more difficult to access the data ports of a programmable component—and, more generally, of an electronic component—that it comprises, after breaking the bus between the probe and said electronic component.

BRIEF SUMMARY OF THE INVENTION

To this end, at least one embodiment of the invention relates to an electronic circuit of the above-mentioned type, further comprising, for each data port:

- a current injection terminal;
- a breakable electrical trace located in the thickness of the substrate and extending between the data port and the injection terminal, each breakable electrical trace comprising a fusible segment and being configured to break, by melting of the fusible segment, upon the injection, at the injection terminal, of an electric current having an intensity greater than a predetermined trace breaking threshold.

Indeed, since the breakable electrical trace is buried in the substrate of the electronic circuit, the breaking of the fusible segment has the effect of physically isolating the data port (or, more precisely, the part of the breakable electrical trace located between the data port and the fusible segment) from the outside. Therefore, in one or more embodiments, an intrusion aiming to access the data port is greatly compromised, insofar as it would require damaging the substrate to access the broken electrical trace, with a non-negligible risk of irreversibly damaging the electronic circuit.

According to one or more embodiments of the invention, the electronic circuit comprises one or more of the following features, taken either alone or according to all technically possible combinations:

- each breakable electrical trace further comprises a first conductive segment connected between the fusible segment and the injection terminal;
- the fusible segment has an electrical resistance per unit length greater than an electrical resistance per unit length of the first conductive segment;
- the fusible segment has a thermal resistance greater than a thermal resistance of the first conductive segment;
- the fusible segment has a section smaller than a section of the first conductive segment;
- each breakable electrical trace further comprises a second conductive segment connected between the fusible segment and the data port;
- the electronic circuit further comprises, for each data port, a current output terminal for connection to a potential reference;
- each electronic component is connected to the current output terminal;
- each breakable electrical trace further comprises an auxiliary conductive segment located in the thickness of the substrate and connected between the corresponding fusible segment and the current output terminal;
- for at least one data port:
- the first conductive segment and the auxiliary conductive segment of the corresponding breakable electrical trace extend along a same first axis; and
- the second conductive segment of the corresponding breakable electrical trace extends along a second axis that is not parallel, preferably perpendicular, to the first axis;
- for at least one data port:
- the first conductive segment, the second conductive segment and the auxiliary conductive segment of the corresponding breakable electrical trace extend along parallel axes; and
- the current output terminal is closer to the injection terminal than to said data port;
- for each data port, at least one of the first conductive segment and the auxiliary conductive segment of the corresponding breakable electrical trace comprises a first part and a second part closer to the fusible segment than the first part, a width of the second part being greater than a width of the first part in order to form a heat sink.

Furthermore, at least one embodiment of the invention relates to a method for protecting an electronic component comprised in an electronic circuit as defined hereinbefore, the method comprising, for each data port, the steps of:

connecting the injection terminal to a current source; and injecting, at the injection terminal, an electric current having an intensity greater than the predetermined trace breaking threshold.

According to one or more embodiments of the invention, the protection method comprises the following feature:

The electronic component is configured so that, when a first polarization is applied to it, each data port has a high-impedance state, the method comprising, for each data port, prior to the injection step, the following steps:

first polarization of the electronic component so that the data port is in the high-impedance state; and connecting the current output terminal to the current source in order to allow electric current to flow between the injection terminal and the current output terminal through the corresponding breakable electrical trace.

BRIEF DESCRIPTION OF THE DRAWINGS

The one or more embodiments of the invention will be better understood on reading the following description, given solely by way of non-limiting example and with reference to the accompanying drawings, wherein.

DETAILED DESCRIPTION OF THE INVENTION

It is clearly understood that the one or more embodiments that will be described hereafter are by no means limiting. In particular, it is possible to imagine variants of the one or more embodiments of the invention that comprise only a selection of the features disclosed hereinafter in isolation from the other features disclosed, if this selection of features is sufficient to confer a technical benefit or to differentiate the one or more embodiments of the invention with respect to the prior art. This selection comprises at least one preferably functional feature which is free of structural details, or only has a portion of the structural details if this portion alone is sufficient to confer a technical benefit or to differentiate the one or more embodiments of the invention with respect to the prior art.

In particular, all of the described variants and the one or more embodiments can be combined with each other if there is no technical obstacle to this combination.

In the figures and in the remainder of the description, the same reference has been used for the features that are common to several figures.

Figure 1:
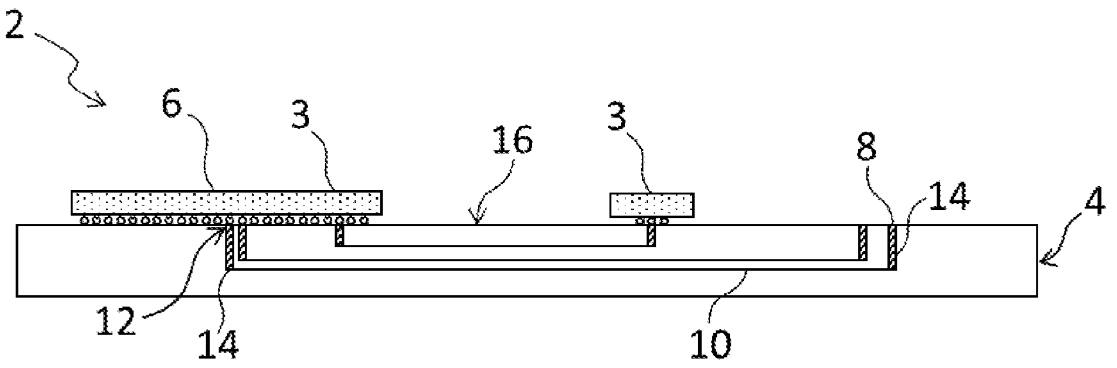
FIG. 1 is a sectional view of an electronic circuit according to one or more embodiments of the invention, in a plane orthogonal to a substrate of the circuit.

An electronic circuit 2 according to one or more embodiments of the invention is illustrated by FIG. 1.

As shown in FIG. 1, the electronic circuit 2 comprises a substrate 4, on which at least one electronic component 3 is arranged.

The electronic circuit 2 further includes at least one current injection terminal 8 (referred to hereinafter as "injection terminal"), and at least one breakable electrical trace 10.

The electronic component 3 is, for example, a programmable component 6. Alternatively, the electronic component 3 is not a programmable component; in this case, the electronic component 3 is, for example, an interface, such as a connector.

In the case where the electronic component 3 is a programmable component 6, by way of at least one embodiment, said programmable component 6 belongs, for example, to the family of Programmable Logical Devices (PLDs), such as a Field-Programmable Gate Array (FPGA). Alternatively, in at least one embodiment, the programmable component 6 is a Central Processing Unit (CPU), or a microcontroller.

The electronic component 3 includes at least one data port 12 for receiving data intended for said electronic component 3.

Each data port 12 of the electronic component 3 is associated with an injection terminal 8 of the electronic circuit 2. In particular, in at least one embodiment, for each data port 12, the corresponding injection terminal 8 is intended to authorize the user to apply the data intended for the electronic component 3 that have been mentioned previously.

More specifically, in at least one embodiment, each data port 12 is electrically connected to the corresponding injection terminal 8 by means of a breakable electrical trace 10 extending between the data port 12 and the associated injection terminal 8.

Furthermore, in at least one embodiment, each breakable electrical trace 10 is located in the thickness of the substrate 4, so that the breakable electrical trace 10 is physically isolated from the outside. In this case, in at least one embodiment, each injection terminal 8 and each data port 12 is, for example, electrically connected to the corresponding breakable electrical trace 10 by means of a respective via 14, extending from an external surface 16 of the substrate 4 to the breakable electrical trace 10.

In the case where the electronic component 3 is a programmable component 6, as illustrated by FIG. 1, the data port 12 is, especially, intended for the configuration of said programmable component 6. In particular, in at least one embodiment, each data port 12 is intended to authorize a user to write, in the programmable component 6, instructions relating to the configuration of the programmable component 6. In this case, in at least one embodiment, the corresponding injection terminal 8 is intended to authorize the user to apply instructions relating to the configuration of the programmable component 6.

Figure 2:
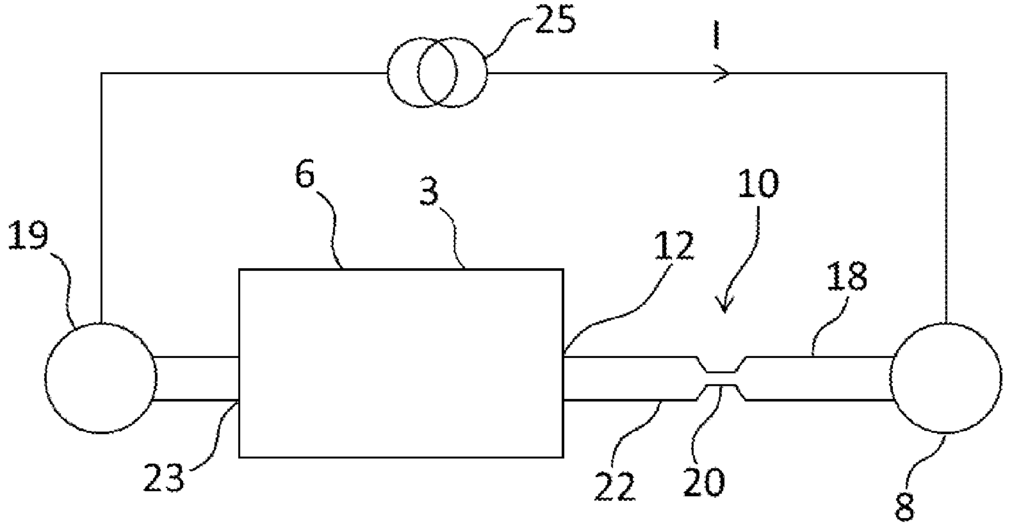
FIG. 2 is a schematic depiction of the electronic circuit of FIG. 1, during the implementation of the protection method, according to one or more embodiments of the invention.

As illustrated by FIG. 2, by way of one or more embodiments of the invention, each breakable electrical trace 10 comprises a first conductive segment 18, a fusible segment 20 and a second conductive segment 22, arranged in this order between the injection terminal 8 and the data port 12.

The first conductive segment 18, the fusible segment 20 and the second conductive segment 22 are each made of a conductive material, so as to ensure electrical continuity between the injection terminal 8 and the data port 12, as long as said electrical continuity is desired.

The breakable electrical trace 10 is further configured to break, by melting of the corresponding fusible segment 20, upon the injection, at the injection terminal 8, of an electric current I having an intensity greater than a predetermined trace breaking threshold.

The trace breaking threshold is preferably between 0.5 A (amps) and 2 A, for example between 0.75 A and 1.25 A, for a breakable electrical trace 10 having a section between 2.7 and 4.5 $mm^2$ at the first conductive segment 18, and a section between 1.8 and 2.7 $mm^2$ at the fusible segment 20.

Preferably, by way of one or more embodiments, the fusible segment 20 has a greater electrical resistance per unit length than the electrical resistance per unit length of the first conductive segment 18. In this case, in at least one embodiment, the flow of the electric current I along the breakable electrical trace 10 causes its heating by the Joule effect, and in particular a greater local heating at the fusible segment 20. If the electric current I has an intensity greater than the predetermined trace breaking threshold, the local heating of the fusible segment 20 causes it to melt, resulting in the breaking of the breakable electrical trace 10.

Alternatively, or additionally, in one or more embodiments, the fusible segment 20 has a thermal resistance greater than the thermal resistance of the first conductive segment 18. In this case, in at least one embodiment, the flow of the electric current I along the breakable electrical trace 10 causes heating by locally greater Joule effect at the fusible segment 20. In the same way as previously, in at least one embodiment, if the electric current I has an intensity greater than the predetermined trace breaking threshold, the local heating of the fusible segment 20 causes it to melt, resulting in the breaking of the breakable electrical trace 10.

For example, in one or more embodiments, a greater electrical resistance per unit length at the fusible segment 20 and/or a greater thermal resistance at the fusible segment 20 are likely to be reached by designing a breakable electrical trace 10 in which the fusible segment 20 has a section smaller than a section of the first conductive segment 18, so as to form a restriction, or a constriction, at the fusible segment 20.

"Section" is understood, within the meaning of one or more embodiments of the invention, to mean a cross-section, that is to say, in a plane orthogonal to a direction along which the breakable electrical trace 10 extends locally.

Alternatively, or in a complementary manner, by way of at least one embodiment, a greater electrical resistance per unit length at the fusible segment 20 and/or a greater thermal resistance at the fusible segment 20 are likely to be reached by designing a breakable electrical trace 10 in which the fusible segment 20 is made of a conductive material different from that of which the first conductive segment 18 and the second conductive segment 22 are made.

Preferably, in one or more embodiments, the electronic circuit 2 further comprises a current output terminal 19 (referred to as "output terminal 19"), intended to be connected to an electric potential reference, for example for grounding the electronic circuit 2.

In this case, in at least one embodiment, the electronic component 3 is preferably also connected to the output terminal 19, for example via an output port 23.

The disconnection of the electronic component 3, in order to protect it against intrusions, is described next with reference to FIGS. 2 and 3, according to one or more embodiments of the invention.

When the disconnection of the electronic component 3 is desired (for example, if it is a programmable component 6, when the programming of said programmable component 6 is completed), for each data port 12, the corresponding injection terminal 8 is connected to a current source 25, as illustrated in FIG. 2.

Preferably, in one or more embodiments, the electronic component 3 is also connected to the output terminal 19, which is itself connected to the current source 25.

Then, the current source 25 is turned on so as to inject, at the injection terminal 8, an electric current I having an intensity greater than the trace breaking threshold associated with the corresponding breakable electrical trace 10.

Figure 3:
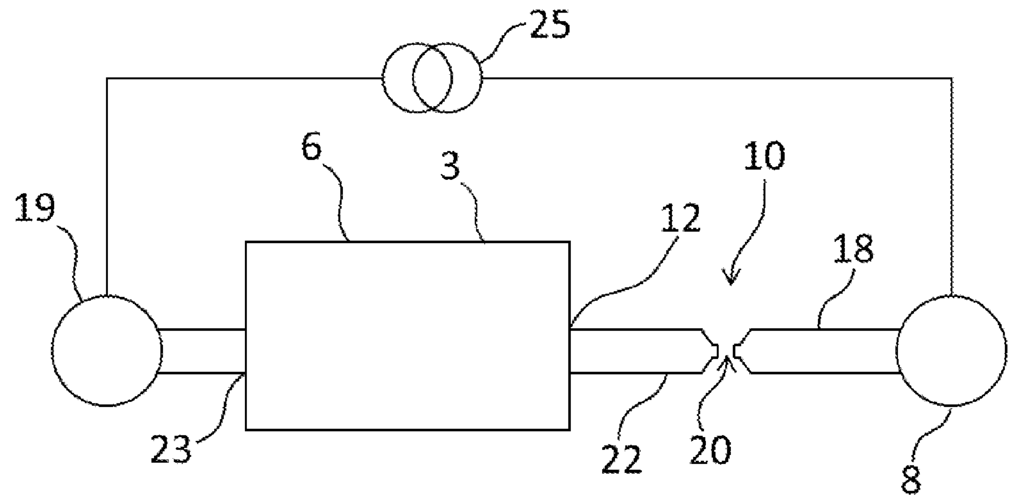
FIG. 3 is a depiction analogous to FIG. 2, after the implementation of the protection method, according to one or more embodiments of the invention.

This results in the melting of the fusible segment 20 and thus in the breaking of the breakable electrical trace 10, as illustrated by FIG. 3, according to one or more embodiments of the invention. Access to the data port 12 of the electronic component 3 is then no longer possible.

Figure 4:
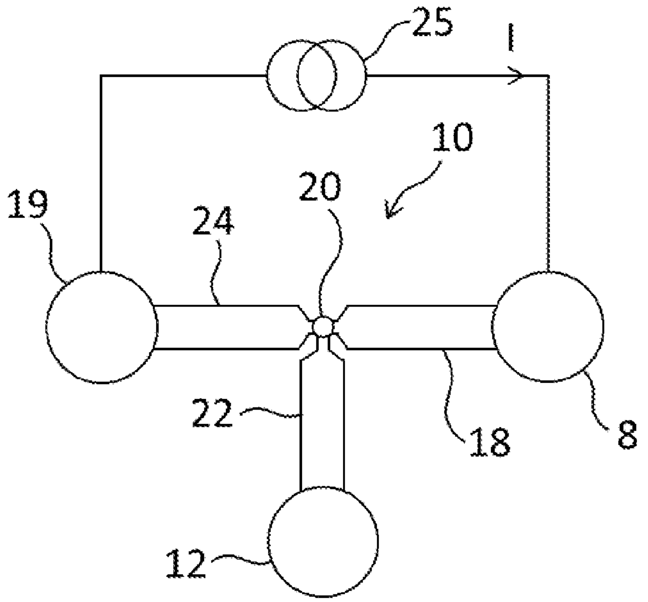
FIG. 4 is a schematic depiction of a second embodiment of an electronic circuit, during the implementation of the protection method, according to one or more embodiments of the invention.
Figure 5:
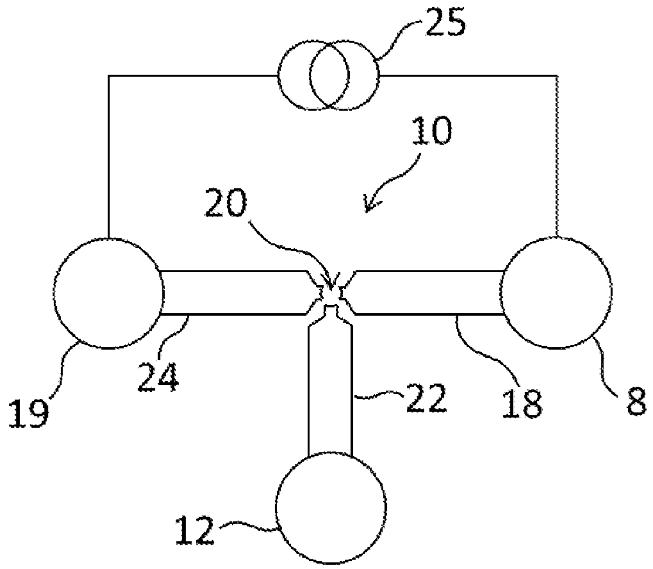
FIG. 5 is a depiction analogous to FIG. 4, after the implementation of the protection method, according to one or more embodiments of the invention.

At least one embodiment of the invention is illustrated by FIGS. 4 and 5. By way of one or more embodiments, especially, to a situation in which the electronic component 3 (not shown) is configured so that, when a predetermined polarization (referred to as "first polarization") is applied to said electronic component 3, each data port 12 is in a high-impedance state. This feature is especially present in certain programmable components 6.

The electronic circuit 2 of FIG. 4 differs from the electronic circuit of FIG. 2 only in that, for each data port 12, the breakable electrical trace 10 also comprises an auxiliary conductive segment 24.

Like the first conductive segment 18, the fusible segment 20, and the second conductive segment 22 of the corresponding breakable electrical trace 10, each auxiliary conductive segment 24 is also located in the thickness of the substrate 4.

Furthermore, in at least one embodiment, for each data port 12, the associated auxiliary conductive segment 24 is electrically connected between the output terminal 19 and the fusible segment 20 of the corresponding breakable electrical trace 10.

The disconnection of the electronic component 3, in order to protect it against intrusions, is described next with reference to FIGS. 4 and 5, according to one or more embodiments of the invention.

When the disconnection of the electronic component 3 is required (for example, if it is a programmable component, when the programming of said programmable component 6 is completed), the first polarization is applied to the electronic component 3 so that each data port 12 is in its high-impedance state.

Furthermore, in at least one embodiment, for each data port 12, the corresponding injection terminal 8 is connected to the current source 25. The output terminal 19 is also connected to the current source 25, to allow electric current to flow between the injection terminal 8 and the output terminal 19 through the corresponding breakable electrical trace 10, especially through the corresponding first conductive segment 18, fusible segment 20, and auxiliary conductive segment 24.

Then, the current source 25 is turned on so that an electric current I flows between the injection terminal 8 and the output terminal 19.

When the data port 12 is in a high-impedance state, the electric current injected at the injection terminal 8 cannot enter the electronic component 3 by the data port 12, which prevents any degradation of the electronic component 3.

If the electric current I has an intensity greater than the trace breaking threshold associated with the corresponding breakable electrical trace 10, the fusible segment 20 melts, and the breakable electrical trace 10 is broken, as illustrated by FIG. 5, according to one or more embodiments of the invention. Access to the data port 12 of the electronic component 3 is then no longer possible.

At least one embodiment of the invention, as shown in FIGS. 4 and 5, is advantageous in that the electric current applied to break the fusible segment 20 does not flow in the second conductive segment 22 (and therefore does not reach the electronic component 3), the data port 12 being in its high-impedance state. An uncontrolled alteration of the electronic component 3, due to the electric current I injected and likely to occur in the at least one embodiment of the invention, as shown in FIGS. 2 and 3, is thus avoided.

Figure 6:
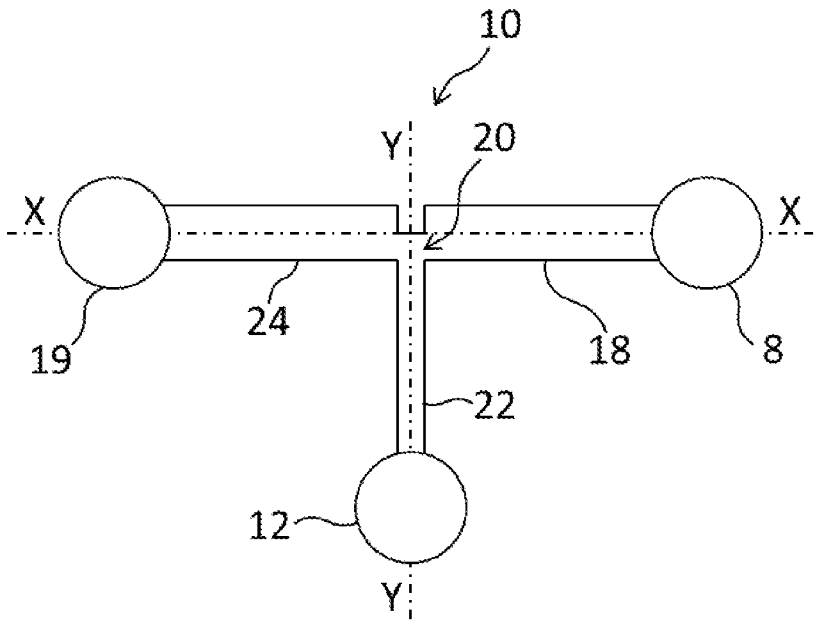
FIG. 6 is a schematic depiction, in a plane parallel to the substrate, of a first variant of a breakable electrical trace of the electronic circuit of FIG. 4, according to one or more embodiments of the invention.
Figure 7:
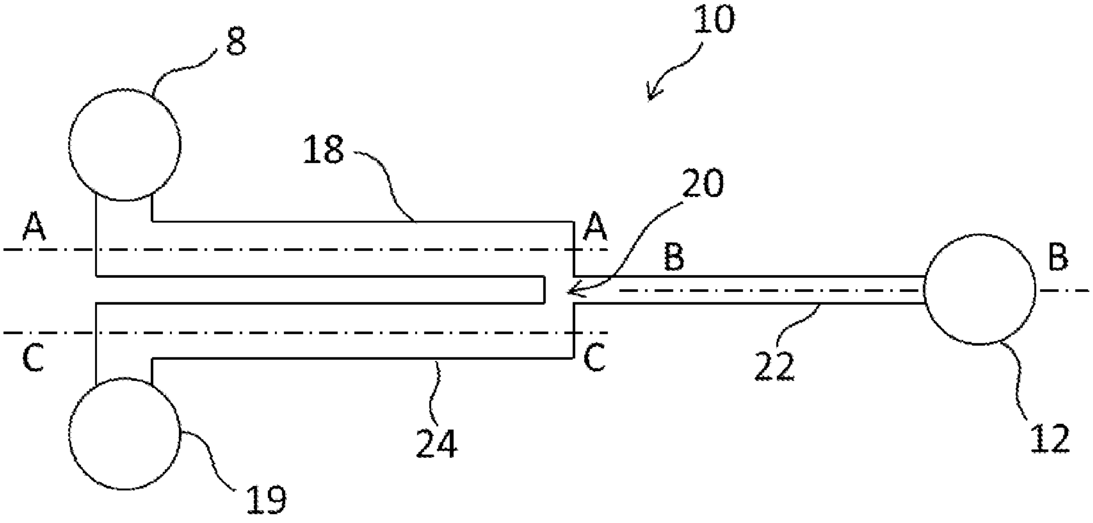
FIG. 7 is a schematic depiction, in a plane parallel to the substrate, of a second variant of the breakable electrical trace of the electronic circuit of FIG. 4, according to one or more embodiments of the invention.
Figure 8:
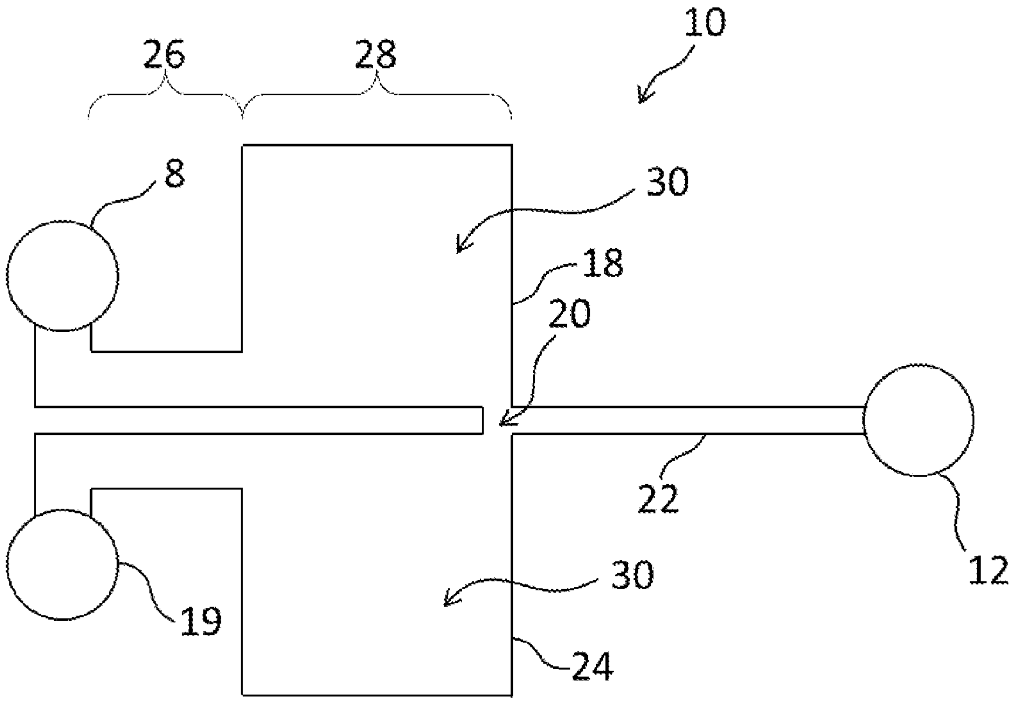
FIG. 8 is a schematic depiction, in a plane parallel to the substrate, of a third variant of the breakable electrical trace of the electronic circuit of FIG. 4, according to one or more embodiments of the invention.

FIGS. 6 to 8 illustrate various possible arrangements of the breakable electrical trace 10, according to one or more embodiments of the invention.

For example, a so-called "T-shaped" geometry is depicted in FIG. 6.

In this case, by way of at least one embodiment, the first conductive segment 18 and the auxiliary conductive segment 24 of the breakable electrical trace 10 extend along a same first axis X-X.

Furthermore, in at least one embodiment, the second conductive segment 22 of the breakable electrical trace 10 extends along a second axis Y-Y not parallel to the first axis X-X. Preferably, the second axis Y-Y is perpendicular to the first axis X-X.

Such a geometry is advantageous, insofar as it limits the impact of the heat generated on the other conductors of the electronic circuit 2.

Preferably, in at least one embodiment, the junction area between the first conductive segment 18, the auxiliary conductive segment 24 and the second conductive segment 22 includes a recess defining the fusible segment 20.

According to one or more embodiments of the invention, a linear geometry is depicted in FIG. 7.

In this case, the first conductive segment 18, the second conductive segment 22 and the auxiliary conductive segment 24 of the breakable electrical trace 10 extend along parallel axes A-A, B-B, and C-C, respectively.

More specifically, the axis B-B extends between the axes A-A and C-C.

Furthermore, in at least one embodiment, the output terminal 19 is closer to the injection terminal 8 than to the data port 12 connected to the second conductive segment 22. In other words, the injection terminal 8 and the output terminal 19 are arranged on the same side with respect to the fusible segment 20.

Such a geometry is advantageous, insofar as it limits the bulk.

Preferably, by way of at least one embodiment, the second conductive segment 22 is offset along the axis B-B so that the junction area between the first conductive segment 18, the second conductive segment 22, and the auxiliary conductive segment 24 has dimensions favorable to local heating greater than that of the first conductive segment 18 and the auxiliary conductive segment 24, thus defining the fusible segment 20.

By way of one or more embodiments, a so-called "fin" geometry is depicted in FIG. 8. Such a geometry is capable of being combined with one or the other of the T-shaped geometry (FIG. 6) and the linear geometry (FIG. 7).

In this case, at least one of the first conductive segment 18 and the auxiliary conductive segment 24 comprises a first part 26 and a second part 28. The second part 28 is closer to the fusible segment 20 than the first part 26.

Furthermore, in at least one embodiment, the second part 28 has a width greater than a width of the first part 26, to form a heatsink 30, also referred to as "fin".

"Width of an electrical trace" is understood, within the meaning of one or more embodiments of the invention, to mean the dimension, in the plane of the substrate 4, which is orthogonal to the axis of said electrical trace.

Such a geometry is advantageous, insofar as the fins 30 accentuate the dissipation of heat in the first conductive segment 18 and/or in the auxiliary conductive segment 24, in the vicinity of the fusible segment 20, which has the effect of concentrating the heat in the fusible segment 20.

The feature according to which the fusible segment 20 has a greater electrical resistance per unit length and/or a greater thermal resistance and/or a section smaller than that of the first conductive segment 18 is advantageous, in at least one embodiment, insofar as it promotes greater local heating at the fusible segment 20 during the flow of the electric current I along the breakable electrical trace 10.

The presence of the auxiliary conductive segment 24 is advantageous, in at least one embodiment, insofar as, when the data port 12 of the electronic component 3 is able to have a high-impedance state, it results in that the electric current applied to break the fusible segment 20 does not flow in the second conductive segment 22 when said data port 12 is in its high-impedance state, and therefore does not reach the electronic component 3. In this way, an uncontrolled alteration of the electronic component 3, due to the electric current I injected to degrade the fusible segment 20, is avoided.

The T-shaped geometry is advantageous, in at least one embodiment, insofar as it limits the impact of the heat generated on the other conductors of the electronic circuit 2.

The linear geometry is advantageous, in at least one embodiment, insofar as it limits the bulk.

The presence of fins 30 is advantageous, in at least one embodiment, insofar as said fins 30 accentuate the dissipation of heat in the first conductive segment 18 and/or in the auxiliary conductive segment 24, in the vicinity of the fusible segment 20, which has the effect of concentrating the heat in the fusible segment 20.

What is claimed is:

1. A method for protecting an electronic component comprised in an electronic circuit, wherein said electronic circuit comprises a substrate;

at least one electronic component, wherein each electronic component comprises at least one data port that receives data; and, for each data port of the at least one data port, a current injection terminal, and a breakable electrical trace located in a thickness of the substrate and extending between the each data port and the current injection terminal, wherein the breakable electrical trace comprises a fusible segment, and wherein the breakable electrical trace is configured to break, by melting of the fusible segment, upon an injection, at the current injection terminal, of an electric current having an intensity greater than a predetermined trace breaking threshold;

the method comprising:

for said each data port, connecting the current injection terminal to a current source; and injecting, at the current injection terminal, the electric current having an intensity greater than the predetermined trace breaking threshold;

wherein the breakable electrical trace further comprises a first conductive segment connected between the fusible segment and the current injection terminal, wherein the breakable electrical trace further comprises a second conductive segment connected between the fusible segment and the each data port corresponding therewith, wherein said electronic circuit further comprises, for said each data port, a current output terminal that connects to an electric potential reference, and wherein the breakable electrical trace further comprises an auxiliary conductive segment located in the thickness of the substrate and connected between the fusible segment corresponding therewith and the current output terminal.

2. The method according to claim 1, wherein the at least one electronic component is configured such that, when a first polarization is applied to the at least one electronic component, said each data port comprises a high-impedance state, and the method further comprising, for said each data port, prior to the injecting, first polarization of the at least one electronic component such that the each data port is in the high-impedance state; and connecting a current output terminal to the current source to allow the electric current to flow between the current injection terminal and the current output terminal through the breakable electrical trace corresponding therewith.

3. The method according to claim 1, wherein the fusible segment comprises an electrical resistance per unit length greater than an electrical resistance per unit length of the first conductive segment.

4. The method according to claim 1, wherein the fusible segment further comprises a thermal resistance greater than a thermal resistance of the first conductive segment.

5. The method according to claim 1, wherein the fusible segment comprises a section smaller than a section of the first conductive segment.

6. The method according to claim 1, wherein said each electronic component is connected to the current output terminal.

7. The method according to claim 1, wherein, for said at least one data port, the first conductive segment and the auxiliary conductive segment of the breakable electrical trace corresponding therewith extend along a same first axis; and the second conductive segment of the breakable electrical trace corresponding therewith extends along a second axis that is not parallel and that is perpendicular to the same first axis.

8. The method according to claim 1, wherein, for said at least one data port, the first conductive segment, the second conductive segment, and the auxiliary conductive segment of the breakable electrical trace corresponding therewith extend along parallel axes; and the current output terminal is closer to the current injection terminal than to said at least one data port corresponding therewith.

9. The method according to claim 1, wherein, for said each data port, at least one of the first conductive segment and the auxiliary conductive segment of the breakable electrical trace corresponding therewith comprises a first part and a second part closer to the fusible segment than the first part, wherein a width of the second part is greater than a width of the first part in order to form a heat sink.

* * * * *